United States Patent
Mulkens et al.

(10) Patent No.: US 7,283,208 B2
(45) Date of Patent: *Oct. 16, 2007

(54) LITHOGRAPHIC APPARATUS, METHOD OF MANUFACTURING A DEVICE, AND DEVICE MANUFACTURED THEREBY

(75) Inventors: Johannes Catharinus Hubertus Mulkens, Maastricht (NL); Paul Van Der Veen, Waalre (NL); Roel De Jonge, Veldhoven (NL); Roland Pieter Stolk, Sprang-Capelle (NL)

(73) Assignee: ASML Netherlands B.V., Veldhoven (NL)

( * ) Notice: Subject to any disclaimer, the term of this patent is extended or adjusted under 35 U.S.C. 154(b) by 124 days.

This patent is subject to a terminal disclaimer.

(21) Appl. No.: 10/746,156

(22) Filed: Dec. 29, 2003

(65) Prior Publication Data

US 2004/0189972 A1    Sep. 30, 2004

Related U.S. Application Data

(63) Continuation-in-part of application No. 10/073,259, filed on Feb. 13, 2002, now Pat. No. 6,700,646.

(30) Foreign Application Priority Data

Feb. 14, 2001    (EP) ................... 01301257

(51) Int. Cl.
*G03B 27/72* (2006.01)
*G03B 27/42* (2006.01)

(52) U.S. Cl. .............. 355/69; 355/53; 355/71
(58) Field of Classification Search ........... 355/53, 355/67–71; 250/492.2, 492.22, 548; 356/237.2, 356/399–401
See application file for complete search history.

(56) References Cited

U.S. PATENT DOCUMENTS

| | | | |
|---|---|---|---|
| 4,922,098 A | 5/1990 | Mori et al. | |
| 4,929,083 A | 5/1990 | Brunner | |
| 5,004,913 A | 4/1991 | Kleinerman | |
| 5,081,635 A | 1/1992 | Wakabayashi et al. | |
| 5,892,573 A | 4/1999 | Takahashi et al. | |
| 5,898,477 A | 4/1999 | Yoshimura et al. | |
| 5,929,977 A * | 7/1999 | Ozawa | 355/53 |
| 5,999,247 A * | 12/1999 | Tezuka | 355/71 |
| 6,411,368 B1 | 6/2002 | Matsumoto et al. | |
| 6,630,996 B2 * | 10/2003 | Rao et al. | 356/237.5 |
| 6,700,646 B2 * | 3/2004 | Mulkens et al. | 355/69 |
| 6,806,477 B1 * | 10/2004 | Saito et al. | 250/491.1 |
| 7,108,960 B2 * | 9/2006 | Dierichs | 430/311 |

FOREIGN PATENT DOCUMENTS

| | | |
|---|---|---|
| EP | 0 445 871 | 9/1991 |
| EP | 1 039 510 | 9/2000 |
| JP | 62-204527 | 9/1987 |

* cited by examiner

*Primary Examiner*—Henry Hung Nguyen
(74) *Attorney, Agent, or Firm*—Pillsbury Winthrop Shaw Pittman LLP

(57) ABSTRACT

A lithographic projection apparatus is provided with a sensor for detecting one of luminescence radiation, desorbed particles, or free charges produced by an interaction of the projection beam with a material at surface of a substrate. The luminescence radiation, desorbed particles, or free charges are indicative of the dose delivered to the substrate, and can be detected close to the substrate or at the substrate level to avoid errors due to transmission variations in the optical path from the radiation source to the substrate.

32 Claims, 7 Drawing Sheets

LITHOGRAPHIC APPARATUS, METHOD OF MANUFACTURING A DEVICE, AND DEVICE MANUFACTURED THEREBY

The present Application claims foreign priority under 35 U.S.C. §119(a)-(d)/365(b) based on EP 01301257.0 filed Feb. 14, 2001, the entire contents of which are incorporated herein by reference. The present Application is a Continuation-in-Part of U.S. patent application Ser. No. 10/073,259 filed Feb. 13, 2002 which is now U.S. Pat. No. 6,700,646, the entire contents of which are incorporated herein by reference.

BACKGROUND

1. Field of the Invention

The present invention relates to a lithographic projection apparatus comprising a radiation system for supplying a projection beam of radiation; a support structure for supporting patterning component, the patterning component serving to pattern the projection beam according to a desired pattern; a substrate table for holding a substrate; and a projection system for projecting the patterned beam onto a target portion of the substrate.

2. Discussion of Related Art

The term "patterning component" as here employed should be broadly interpreted as referring to a patterning component that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning components include the following.

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuator. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic components. In both of the situations described hereabove, the patterning component can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning component as hereabove set forth.

Lithographic projection apparatuses can be used, for example, in the manufacture of integrated circuits (ICs). In such a case, the patterning component may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatuses, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer.

Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatuses are described, for example, in U.S. Pat. No. 5,969,441 and WO 98/40791, incorporated herein by reference.

In a lithographic projection process it is important to control accurately the dose (i.e. amount of energy per unit area integrated over the duration of the exposure) delivered to the resist. Known resists are designed to have a relatively sharp threshold, whereby the resist is exposed if it receives an amount of energy per unit area above the threshold but remains unexposed if the amount of received energy is less than the threshold. This is used to produce sharp edges in the features in the developed resist, even when diffraction effects cause a gradual tail-off in intensity of the projected images at feature edges. If the beam intensity is substantially incorrect, the exposure intensity profile can cross the resist threshold at the wrong point. Dose control is thus crucial to correct imaging.

In a known lithographic apparatus dose control is done by monitoring the beam intensity at a point in the radiation system and calibrating the absorption of the apparatus between that point and the substrate level. Monitoring the beam intensity is performed using a partially transmissive mirror to divert a known fraction of the projection beam in the radiation system to an energy sensor. The energy sensor measures the energy in the known fraction of the beam and so enables the beam energy at a given point in the radiation system to be determined. The calibration of the absorption of the apparatus, downstream of the partially transmissive mirror, is done by replacing the substrate by an energy sensor for a series of calibration runs. The output of the energy sensor effectively measures variations in the output of the radiation source and is combined with the calibration results of the absorption of the downstream parts of the apparatus to predict the energy level at substrate level. In some cases the prediction of the energy level at substrate level may take account of parameters of the exposure, e.g. radiation system settings. The exposure parameters, e.g. duration or scanning speed, and/or the output of the radiation source can then be adjusted to deliver the desired dose to the resist.

While the known method of dose control takes account of variations in the output of the radiation source and deals well with predictable variations in absorption downstream of the energy sensor, not all variations in absorption are easily or accurately predictable. This is particularly the case for apparatuses using exposure radiation of shorter wavelengths, which are essential to reduce the size of the smallest features that can be imaged, such as 193 nm, 157 nm, or 126 nm. Such wavelengths are heavily absorbed by air and many other gases so that lithographic apparatuses making use of them must be either flushed with non-absorbing gases or evacuated. Any variations in the composition of the flushing gas or leaks from the outside can result in significant and unpredictable variations in the absorption of the beam in the downstream parts of the apparatus and hence of the dose delivered to the resist.

SUMMARY

An object of the present invention is therefore to provide an improved dose sensing and control system which avoids or alleviates the problems of known energy sensors and dose control systems.

This and other objects are achieved according to the invention in a lithographic apparatus as specified in the opening paragraph which includes a sensor arranged to detect luminescence radiation produced in said projection system by the passage of said projection beam.

The sensor, which may comprise one or more photodiodes, for example, detects luminescence radiation caused by the interaction of the projection beam radiation, such as ultraviolet radiation, with the material of the projection system, such as calcium fluoride or quartz lens elements. The luminescence radiation intensity is indicative of the dose being delivered to the substrate. Unlike other dose sensors, no part of the projection beam is additionally blocked or diverted, because the luminescence radiation is an intrinsic property of the interaction of the projection beam radiation and the lens. Furthermore, the luminescence radiation can be measured from the projection system very close to the substrate, and therefore, unlike other dose measurements, is not prone to errors due to transmission variations in the optical path from the radiation source to the substrate. The luminescence radiation can be measured at the side of or beyond the end of the projection system and therefore can avoid occupying the very limited space between the projection system and the substrate. In addition, the luminescence given off by the substrate or a layer of material on the substrate can also be measured to determine the dose of radiation reaching the substrate.

According to one embodiment, the sensor comprises a plurality of detectors. These can capture the luminescence radiation emitted in different directions and can be summed to produce a signal. According to another embodiment, a radiation guide is provided to direct the luminescence radiation emitted in a plurality of directions all to a single detector. This reduces the cost and wiring complexity of a plurality of detectors, and enables the single detector to be located remote from the projection system to reduce the space overhead and to facilitate exchangeability of the detector.

The particular illumination mode and patterning of the projection beam can result in inhomogeneous generation of luminescence radiation. Thus the luminescence radiation in particular directions can vary between different illumination settings and patterns even though the actual dose on the substrate is the same. In either of the above preferred embodiments this problem can be avoided, because the luminescence radiation emitted in a plurality of directions is detected (using a plurality of detectors or using a waveguide arrangement and a single detector), so the resulting signal can be indicative of the actual dose regardless of the particular illumination mode or patterning of the projection beam.

The projection beam of radiation, such as ultraviolet radiation, interacting with a material at the surface of the substrate, such as a resist layer, can also desorb particles of the resist layer. Therefore, one can also set up a detector in the vicinity of the substrate to detect atoms, molecules and/or ions desorbed from the resist layer and as a result quantify indirectly the amount of radiation reaching the surface of substrate or determine the intensity profile of the projection beam. A detector suitable for detecting the atoms, molecules and/or ions desorbed from the resist layer can be, for example, a channeltron or any other suitable detector used in mass spectrometry.

The projection beam of radiation, such as ultraviolet radiation, interacting with a material at the surface of the substrate, such as on the surface of a semiconductor material and/or a surface of a conductive material, can also lead to formation of free charges, such as electrons. Therefore, one can set up a detector in the vicinity of the substrate to detect the electrons. In this way, the intensity profile of the radiation beam reaching the substrate can be determined.

According to a further aspect of the invention there is provided a device manufacturing method comprising the steps of: providing a substrate that is at least partially covered by a layer of radiation-sensitive material; providing a projection beam of radiation using a radiation system; using a patterning component to endow the projection beam with a pattern in its cross-section; projecting the patterned beam of radiation onto a target area of the layer of radiation-sensitive material on said substrate, and detecting luminescence radiation produced in said projection system by the passage of a projection beam.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "wafer" or "die" in this text should be considered as being replaced by the more general terms "substrate" and "target area", respectively.

In the present document, the terms radiation and beam are used to encompass all types of electromagnetic radiation, but specifically ultraviolet radiation, e.g. with a wavelength of 365, 248, 193, 157 or 126 nm.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF EMBODIMENTS OF THE INVENTION

Embodiment 1

Figure 1:
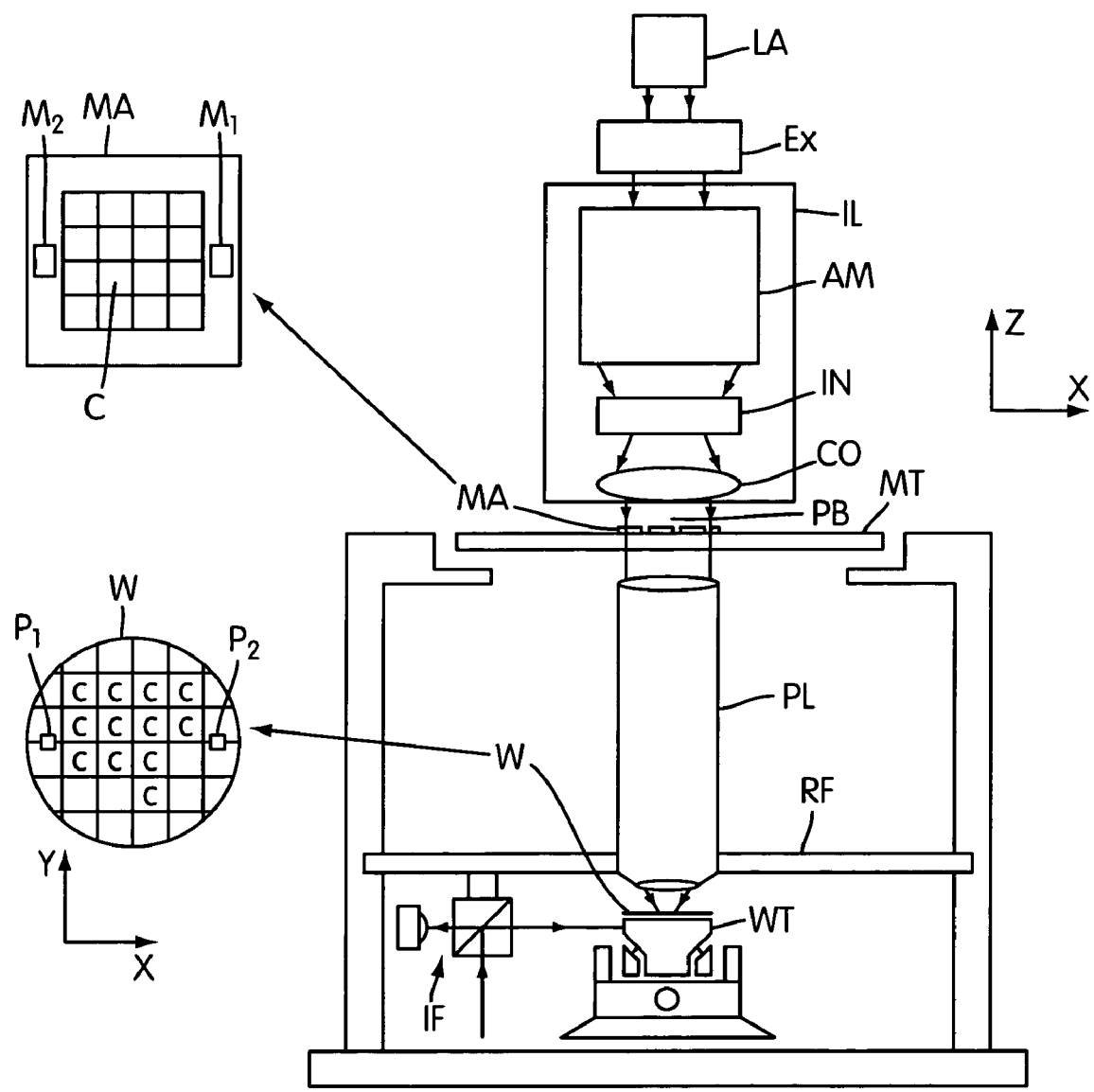
FIG. 1 depicts a lithographic projection apparatus according to an embodiment of the invention.

FIG. 1 schematically depicts a lithographic projection apparatus according to a particular embodiment of the invention. The apparatus comprises: a radiation system LA, Ex, IL, for supplying a projection beam PB of radiation (e.g. UV radiation); a first object table (mask table) MT for holding a mask MA (e.g. a reticle), and connected to first positioning system for accurately positioning the mask with respect to item PL; a second object table (substrate table) WT for holding a substrate W (e.g. a resist-coated silicon wafer), and connected to second positioning system for accurately positioning the substrate with respect to item PL; and a projection system ("lens") PL (e.g. a quartz and/or $CaF_2$ lens system or a catadioptric system comprising lens elements made from such materials) for imaging an irradiated portion of the mask MA onto a target portion C (comprising one or more dies) of the substrate W. As shown in FIG. 1, mask MA is provided with alignment marks $M_1$ and $M_2$ and substrate W is provided with Alignment marks $P_1$ and $P_2$ such that the substrate W and the mask can be aligned relative to each other.

As here depicted, the apparatus is of a transmissive type (i.e. has a transmissive mask). However, in general, it may also be of a reflective type, for example (with a reflective mask). Alternatively, the apparatus may employ another kind of patterning component, such as a programmable mirror array of a type as referred to above.

The radiation system comprises a source LA (e.g. a UV laser) that produces a beam of radiation. This beam is fed into an illumination system (illuminator) IL, either directly or after being passed through conditioning components, such as a beam expander Ex, for example. The illuminator IL comprises adjusting component AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and Claims encompass both of these scenarios.

The beam PB subsequently intercepts the mask MA which is held in a mask holder on a mask table MT. Having traversed the mask MA, the beam PB passes through the lens PL, which focuses the beam PB onto a target portion C of the substrate W. With the aid of the second positioning system (and interferometric measuring component IF), the substrate table WT can be moved accurately, e.g. so as to position different target portions C in the path of the beam PB. Similarly, the first positioning system can be used to accurately position the mask MA with respect to the path of the beam PB, e.g. after mechanical retrieval of the mask MA from a mask library, or during a scan. In general, movement of the object tables MT, WT will be realized with the aid of a long stroke module (course positioning) and a short stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes.

Mode 1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

Mode 2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
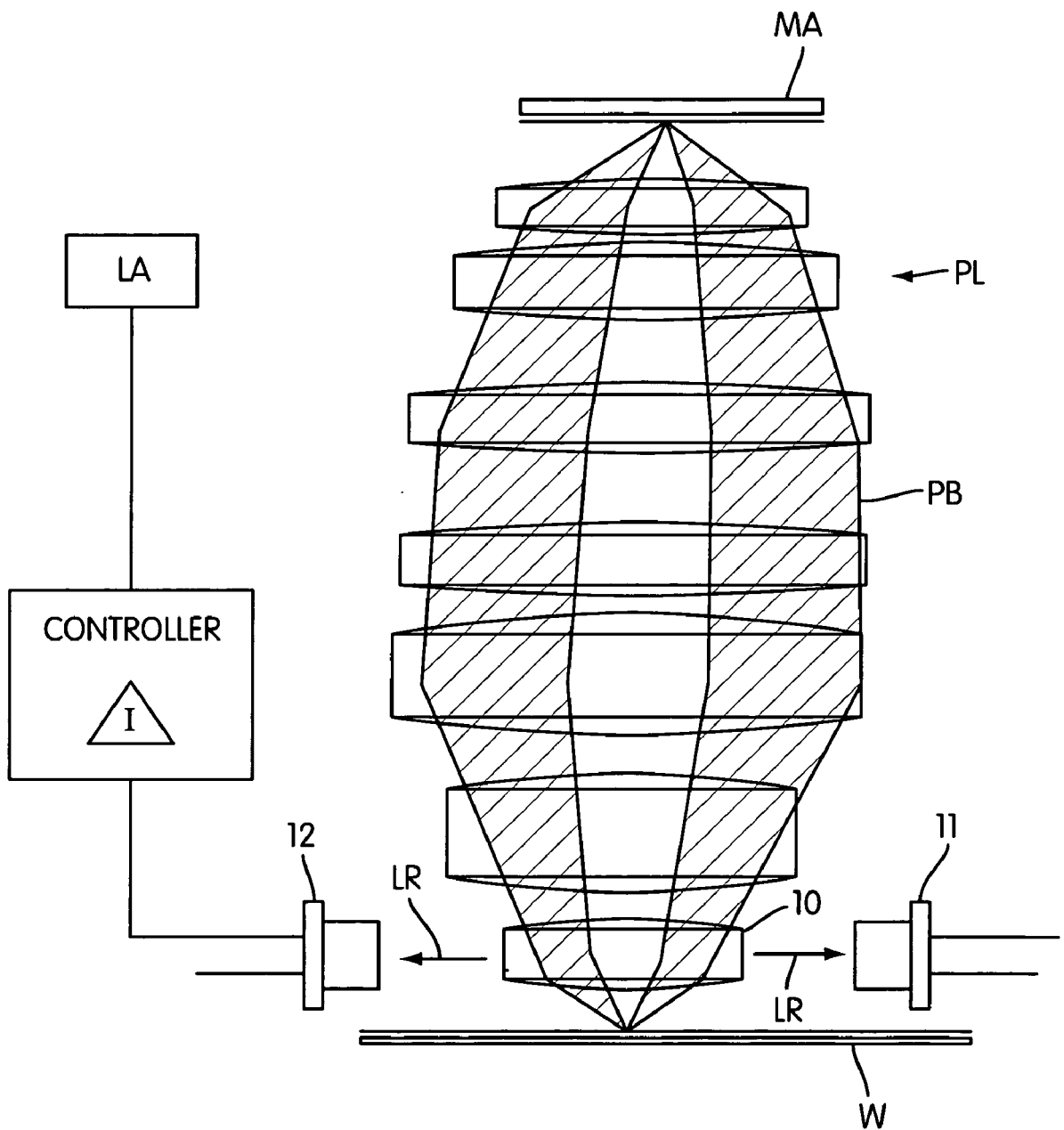
FIG. 2 is a schematic longitudinal cross-section illustrating the projection lens system and part of the luminescence radiation sensor according to a first embodiment of the invention.

FIG. 2 shows a longitudinal cross-section of the projection lens PL between the mask MA and the wafer W. The projection lens PL consists of a stack of many individual lens elements. A pair of detectors 11, 12, such as photodiodes, are positioned on diametrically opposite sides of the projection lens element 10 which is closest to the wafer W. A projection beam PB passes through projection lens PL. If the projection beam PB has a wavelength of, for example, 193 nm, then the material of the projection lens element 10 can be, for example, calcium fluoride or quartz. If the radiation of the projection beam PB has a wavelength of, for example, 157 nm, then the material of the projection lens 10, can be, for example, calcium fluoride (optionally in the presence of mirrors, so as to comprise a catadioptric system). When either of these materials of the projection lens element 10 is irradiated by the laser light of the projection beam PB, some luminescence radiation is produced, shown schematically by the arrows labeled LR. The luminescence radiation is, for example, typically light in the green to yellow part of the visible spectrum. The material of the projection lens element 10 interacts with the high energy, short wavelength, laser radiation of the projection beam PB to convert a tiny proportion of it to longer wavelength luminescence radiation LR. The material of the projection lens element 10 is substantially transparent to the luminescence radiation LR. In the case of a laser source LA, the amplitude of the luminescence radiation is proportional (linearly or almost linearly) to the pulse energy of the laser pulses of the projection beam PB. The detectors 11, 12 are sensitive to the luminescence radiation LR and produce an output current, and in this way the amplitude of the projection beam laser pulses can be measured by measuring the output current signal from the detectors 11, 12. This measurement also gives an indication of the exposure dose on the wafer because the projection lens element 10 immediately precedes the wafer W in the optical path.

Whichever portions of the projection lens element 10 the projection beam PB passes through act as luminescence sources within the projection lens element 10. As can be seen in FIG. 2, the position of the luminescence sources strongly depends on the illumination mode, i.e. the distribution of intensity across the projection beam PB and lens element 10. To avoid this potential source of detected signal variation, more than one detector, such as the pair 11, 12 shown in FIG. 2 are used. However, even more satisfactory results can be obtained according to this embodiment using the arrangement shown in FIG. 3, in which a ring of eight detectors 11-18 are arranged circumferentially spaced apart around the periphery of the projection lens element 10.

A ring circuit shown schematically by the wires 20, 21, is used to connect all the detectors 11-18 in parallel. This arrangement sums the signals from all of the detectors 11-18 to produce an overall sensor signal.

Embodiment 2

Figure 3:
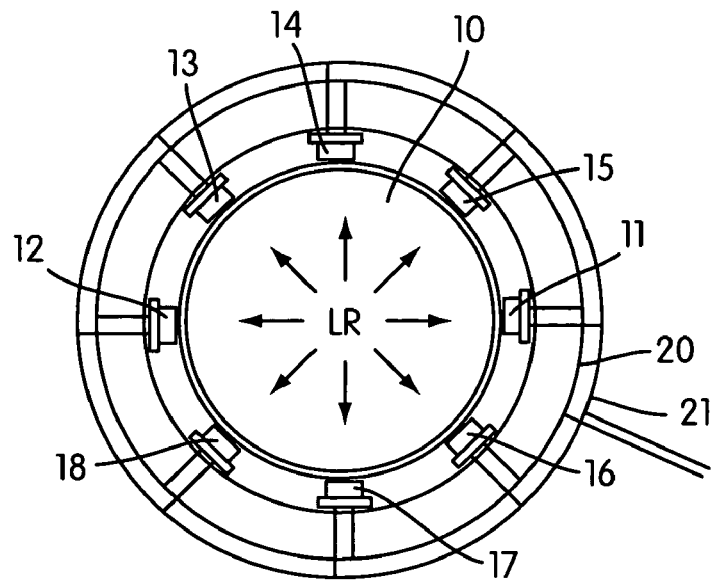
FIG. 3 is a schematic transverse cross-section of the sensor of the embodiment FIG. 2.
Figure 4:
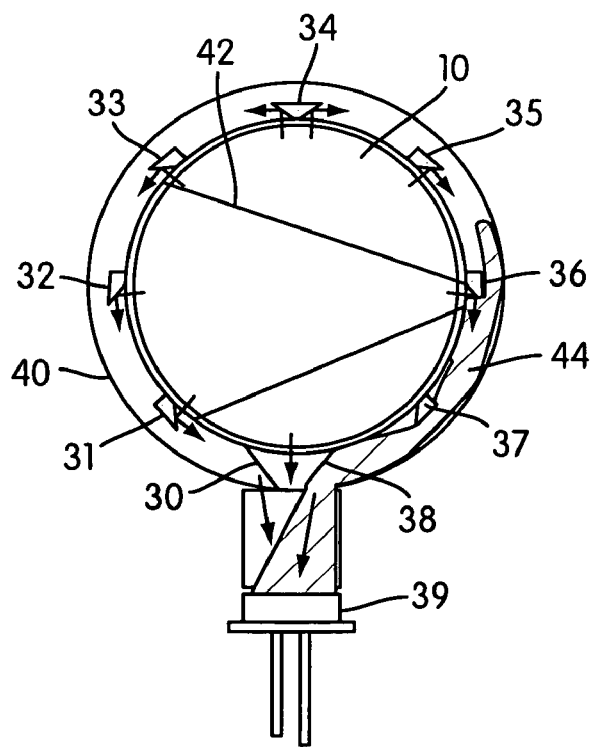
FIG. 4 is a schematic transverse cross-section of the sensor of a second embodiment of the invention.

FIG. 4 shows an arrangement which is essentially the same as that of FIG. 3, except that the detectors have been replaced by reflective elements 30-38 which direct the luminescence radiation to a single detector 39. The inner wall 40 of the projection lens system is also reflective and together with the reflective elements 30-38 forms a reflecting radiation guide. As shown in FIG. 4, one particular reflective element 36 receives luminescence radiation from a wedge-shaped portion 42 of the lens element 10 and reflects it round the radiation guide, as shown by the hatched region 44 to the detector 39. The luminescence radiation directed by all of the other reflective elements has been omitted for clarity, but its path is simply shown by the arrows.

Other suitable radiation guides can be used, such as optical fibres, to direct the luminescence radiation from different portions of the projection lens element 10 to the single detector 39.

Embodiment 3

Figure 5:
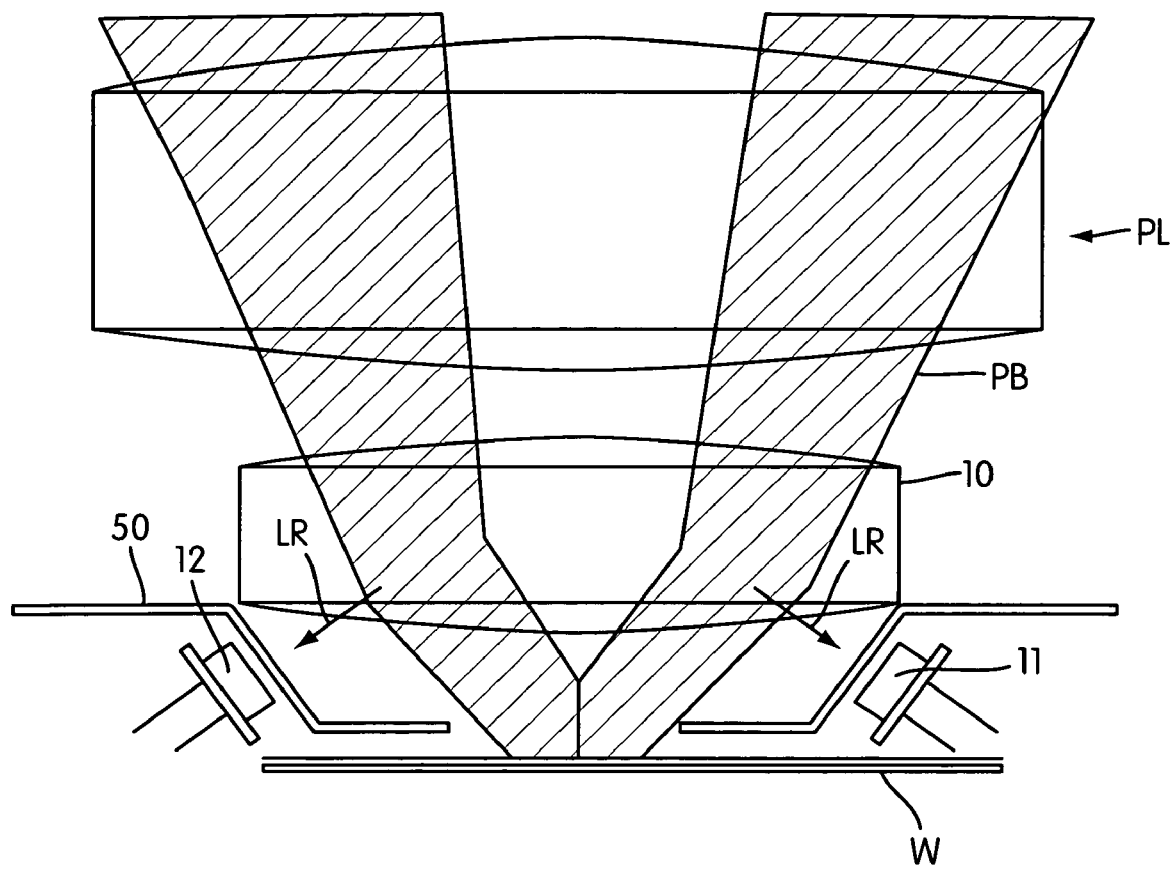
FIG. 5 is a schematic longitudinal cross-section of part of the projection lens and luminescence radiation sensor according to a third embodiment of the invention.

This embodiment can be the same as the preceding embodiments in all respects except that, as shown in FIG. 5, the luminescence radiation LR from the projection lens element 10 is viewed from outside the lens hood 50, which is incorporated into the machine for gas purging reasons. This simplifies the installation of the luminescence radiation sensor and also improves its subsequent accessibility.

Although in FIG. 5 detectors 11 and 12 are shown, as in the first embodiment, it is, of course, possible to replace these by a radiation guide and a single detector as in the second embodiment described above.

In this third embodiment, it will be seen that the luminescence radiation sensor system is located forward of the projection lens element 10 which is closest to the wafer W, rather than being provided in the same plane as the projection lens element 10 as shown in FIGS. 3 and 4. The sensor system detects luminescence radiation emitted from the face of the projection lens element 10 closest to the wafer W. By use of appropriate radiation guides and/or reflective elements, the detectors or detector of this sensor system could, of course, be located elsewhere outside of the lens hood 50.

Embodiment 4

Figure 6:
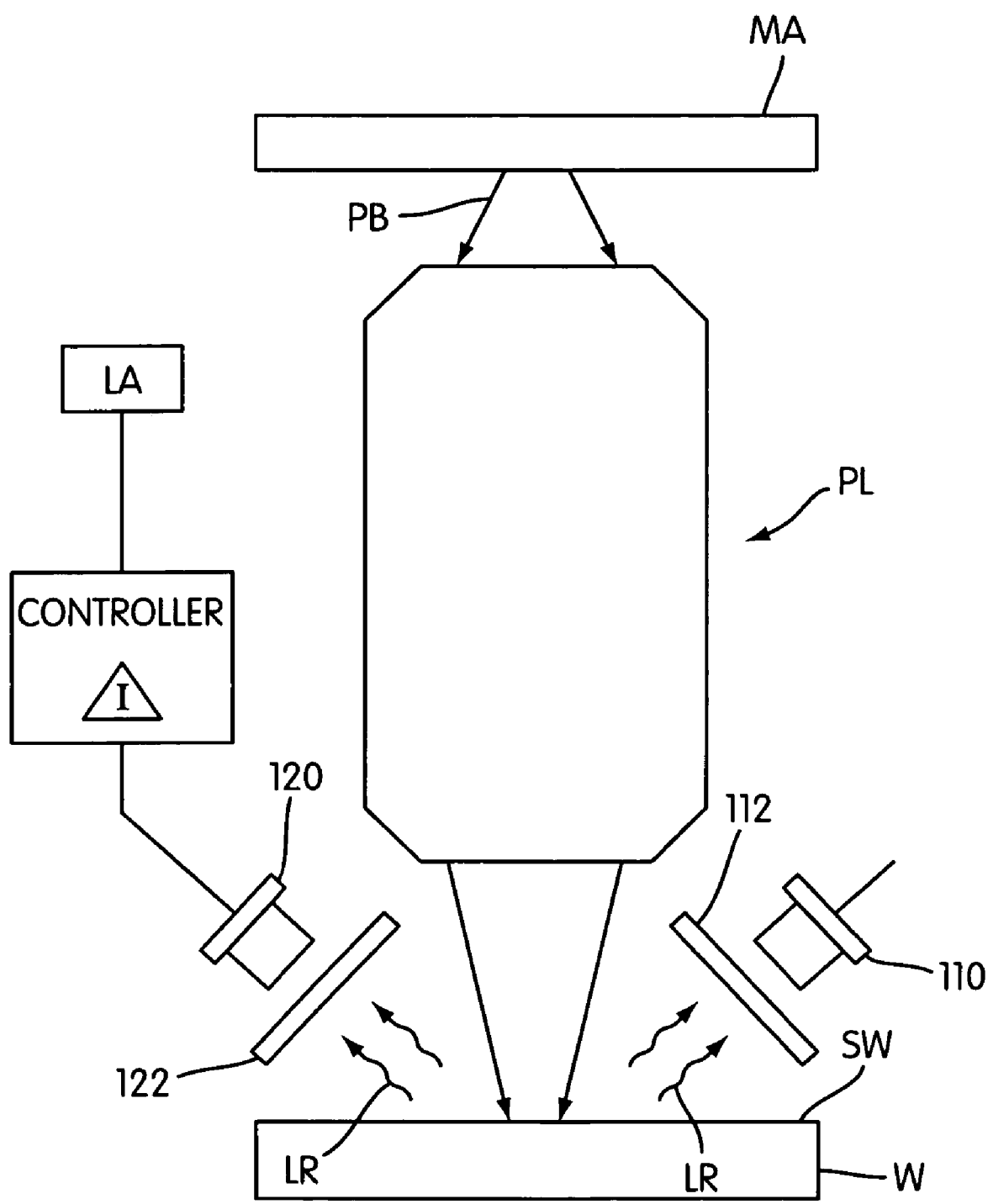
FIG. 6 is a schematic longitudinal view of a lithographic projection system and a part of a luminescence radiation sensor according to a fourth embodiment of the invention.

In FIG. 6, a general structure of a lithographic projection system according to a fourth embodiment of the invention is shown. The lithographic system according to this embodiment may be similar or the same as the embodiments shown in FIGS. 1 and 2. However, instead of measuring the luminescence radiation given off by the projection lens, in the present embodiment the luminescence radiation measured is given off by the substrate or a material deposited on a surface of the substrate. In this embodiment, the luminescence radiation is measured in the vicinity of surface SW of the substrate or wafer W as the radiation of the projection beam PB, such as ultraviolet radiation, interacts also with the substrate material (such as silicon) and gives off luminescent radiation LR. For example, when the substrate material is silicon (Si) and the radiation used in the projection beam PB is Deep Ultraviolet (DUV), the inventors have determined that the luminescence radiation LR is in the infrared (IR) spectrum of wavelengths. Because the projection beam of radiation and the luminescence radiation are at different wavelengths, this allows one to detect separately the luminescence radiation.

Luminescence radiation sensors 110 and 120 are arranged in the vicinity of the surface SW of the Wafer W generally facing the substrate surface such that the luminescence radiation LR emitted from the substrate W can be detected by the luminescence radiation sensors 110 and 120. However, similarly to the previous embodiments, one can also use appropriate radiation guides and/or reflective elements and the detector or detectors of this sensor system could, of course, be located elsewhere away from the substrate W. If the luminescence radiation sensor is broadband, i.e. sensitive to both UV and IR, the luminescence radiation sensor 110 and 120 can be made to only detect the luminescence radiation LR (for example IR or visible) and not the radiation of the projection beam PB by adding filters. For example, radiation filters 112 and 120 can be used and placed in front of detectors 110 and 120 to filter out the radiation of the projection beam PB (for example DUV) which may be reflected of the surface SW of the wafer W and sent in the direction of detectors 110 and 120.

Embodiment 5

Figure 7:
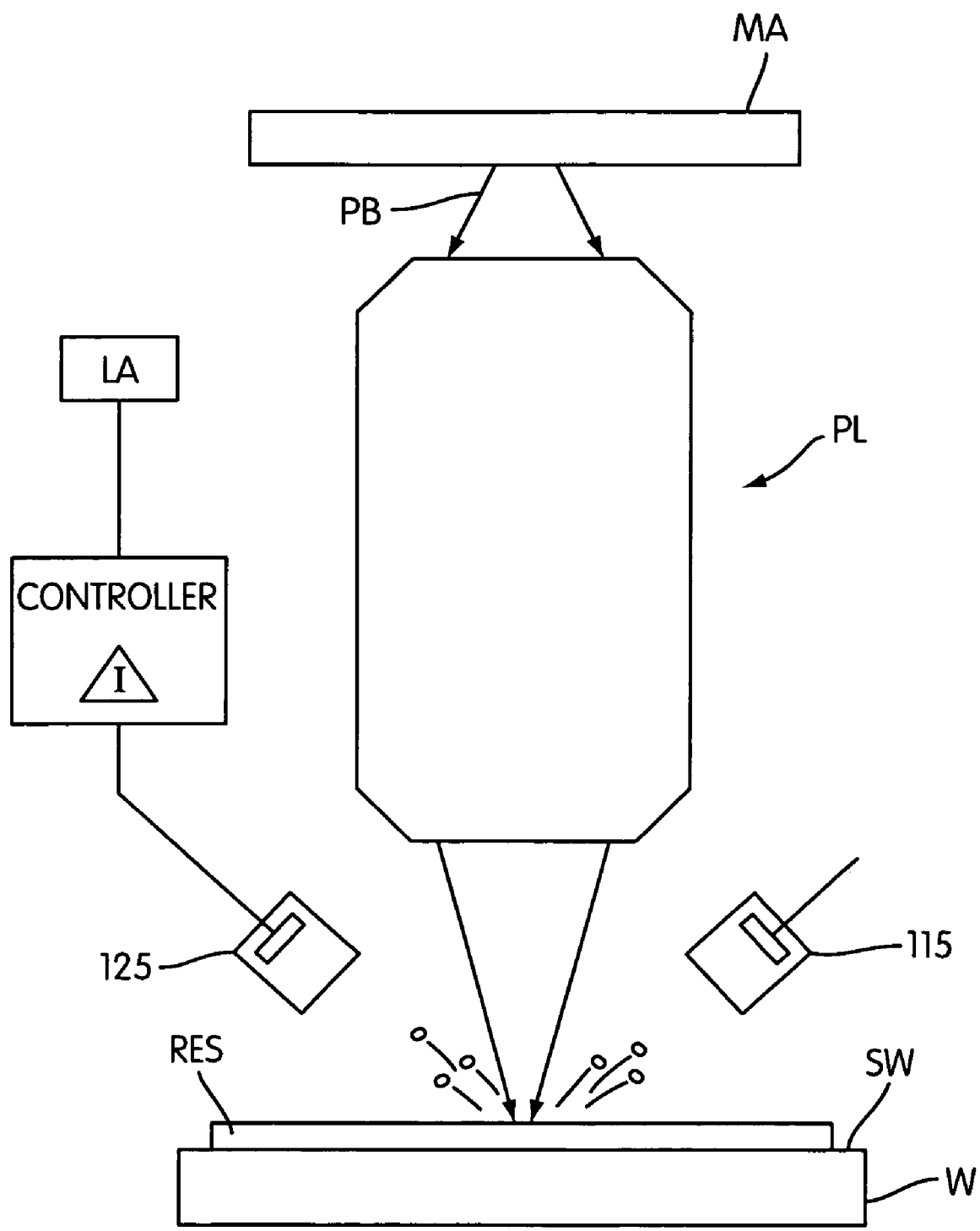
FIG. 7 is a schematic longitudinal view of a lithographic projection system and a part of particle detection system to detect desorbed particles from a surface of the substrate according to a fifth embodiment of the invention.

In FIG. 7, a general structure of a lithographic projection system according to a fifth embodiment of the invention is shown. The lithographic system according to this embodiment may be similar or the same as the embodiments shown in FIGS. 1, 2 and 6. However, instead of measuring a luminescence radiation by a luminescence sensor, in the present embodiment particles desorbed from a surface of the substrate are detected by a particle detector.

In this embodiment, the projection beam of radiation PB, such as ultraviolet radiation, interacts with a material at the surface SW of the substrate W and desorbs particles, i.e., atoms, molecules and/or ions of the material from the surface SW. The material can be, for example, a resist layer RES previously deposited on surface SW of substrate W.

In order to detect the particles, i.e. atoms, molecules and/or ions desorbed from the resist layer RES, detectors 115 and 125 are disposed in the vicinity of the substrate W. For example, detectors 115 and 125 can be positioned generally facing the surface of substrate such that the desorbed particles are intercepted by the detector(s) 115 and 125. Although two detectors are shown in this Figure, one of ordinary skill in the art will appreciate that one can use one, two or more detectors. A detector suitable for detecting atoms, molecules or ions desorbed from the resist layer RES can be, for example, a conventional mass/ion detector such as, for example, a channeltron with optionally a mass selector, such as one found in mass spectrometers.

By detecting and measuring a quantity of particles desorbed from the surface of the substrate and correlating this measured quantity with the intensity of radiation reaching the substrate, one can determine indirectly the intensity profile of radiation reaching the substrate. In this way, it is possible to monitor the projection beam intensity profile at the substrate level and hence adjust for possible variations of the intensity profile of the projection beam at the substrate level.

Embodiment 6

Figure 8:
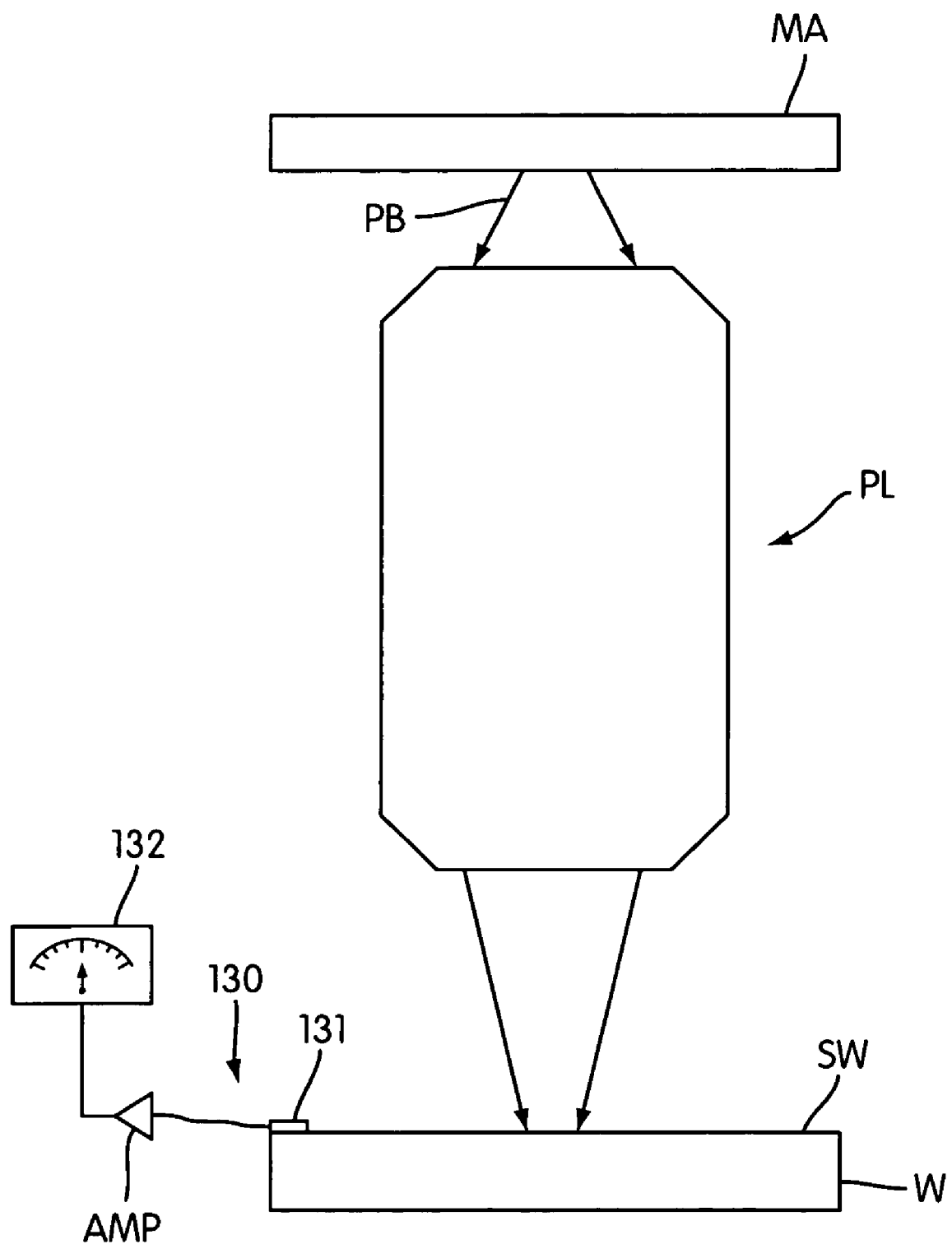
FIG. 8 is a schematic longitudinal view of a lithographic projection system and a part of a detection system for detecting free charges formed at the surface of the substrate according to a sixth embodiment of the invention.

In FIG. 8, a general structure of a lithographic projection system according to a sixth embodiment of the invention is shown. The lithographic system according to this embodiment may be similar or the same as the embodiments shown in FIGS. 1, 2, 6 and 7. However, instead of measuring a luminescence radiation by a luminescence sensor or measuring particles desorbed from a surface of the substrate, in the present embodiment free charges, such as electrons created by the interaction of the radiation in the projection beam with the substrate are detected by a free-charges detector.

In the sixth embodiment, the projection beam of radiation PB, such as ultraviolet radiation, interacts with a material of the substrate W or with a material deposited on the surface SW of substrate W to create free charges, such as electrons, on the surface SW. Indeed, if a material surface is irradiated with radiation, electrons can be extracted from the atomic/molecular structure of the material due to the photoelectric effect. In this example, the substrate W or the material deposited on the surface SW of the substrate W is one of an electrically conductive material and/or a semiconductor material.

In order to detect the free charges, i.e., the electrons extracted by the interaction of the radiation of the projection beam PB, a charge detection system 130 is disposed in the vicinity of the surface SW of substrate W. For example, the charge detection system may comprise an electrode 131 disposed in contact with surface SW to draw the free charges, e.g. electrons and form an electronic signal. An electron amplifier AMP can be added and used to amplify the electronic signal. The output of the amplifier AMP is connected to an ammeter or voltmeter 131 to allow reading the output signal. The output of amplifier AMP can also be connected to, for example, an Analog-to-Digital (ADC) device to transform the electronic signal (analog) into digital format (digital signal). In this case, the digital signal can be sent to a digital device such as a computer for recording and archiving.

Although only one electrode 131 is shown in this Figure, one of ordinary skill in the art would appreciate that the charge detection system can include more than one electrode. For example, if a plurality of electrodes are used, each electronic signal at each electrode can be amplified separately or the electrodes can be connected to each other and the sum of the electronic signal from all or a portion of the electrodes amplified by one amplifier. The electrodes can be disposed directly in contact with the surface SW of the substrate W or, alternatively, the electrodes can be disposed in the vicinity of the surface SW, for example, slightly above the surface SW at a periphery of the substrate W (not shown in FIG. 8). If the electrodes are disposed slightly above the surface SW and the electrodes are connected to a positive potential, for example, each of the electrodes may then detect the electron cloud that has drifted towards each of the electrodes. In this case, each electronic signal at each electrode of the plurality of electrodes will be amplified separately. In this way, this will not only allow measuring the intensity of the electronic signal at each individual electrode but also the distribution of electrons on the surface of the substrate.

Similar to the previous embodiment, by detecting and measuring a quantity of free charges at the surface of substrate and correlating this measured quantity with the intensity of radiation reaching the substrate, one can determine indirectly the intensity profile of radiation reaching the substrate. In this way, it is possible to monitor the projection beam intensity profile at the substrate level and hence control the projection beam to adjust for possible variations of the intensity profile in the projection beam.

In all the above embodiments of the invention, the signal from the luminescence radiation, particles or free charges sensor system can be integrated over all pulses in the exposure to produce an integrated sensor signal, instead of using the individual pulses. Alternatively, the calculated dose is stored in a memory which holds a history of the doses delivered by previous pulses. Since the exposure of a given target area on the substrate is built up from the doses delivered by a plurality of pulses, the history of previous pulses making up the current exposure is used to determine any necessary correction to be applied to subsequent pulses of the exposure. In either case, any necessary corrections and adjustments for dose control can be effected, for example, by adjustment of the intensity of the radiation source LA, by adjusting the opening time of a shutter, by adjusting the degree of opening of an iris located at an aperture plane of the illumination system, by adjusting the pulse repetition rate, by adjusting the scanning speed in a step-and-scan apparatus, or any suitable combination of these parameters.

The luminescence radiation sensor, desorbed particle detector or free charge detector can, of course, be used in addition to an energy sensor in the illumination system, and both can be used to support dose control. The luminescence radiation sensor, desorbed particle detector or free charge detector can give useful information about what is happening around or at the wafer level during exposures. The luminescence radiation sensor, desorbed particle detector or free charge detector can, for example, be used for fine-tuning the laser pulse set point during scan. Furthermore, the luminescence of the projection lens elements can vary over time, particularly over long time scales such as the lifetime of the lens. Parameters can be included in the dose control setting of the lithographic projection apparatus to compensate for this drift in the luminescence radiation detected by the sensor.

However, in the case where the luminescence is detected on the surface of the substrate one does not have to adjust for the drift in luminescence of the lens system since the quantity measured is the luminescence at the surface of the substrate. Moreover, in the case where the quantity detected/measured is an amount of desorbed particles or an amount of free charges, the compensation for the drift in luminescence radiation would not be necessary as the quantity detected does not depend on luminescence. This would eliminate a parameter and thus would facilitate measurements of the intensity profile of the radiation beam.

While specific embodiments of the invention have been described above, it will be appreciated that the invention may be practiced otherwise than as described. The description is not intended to limit the invention.

We claim:

1. A lithographic projection apparatus, comprising:
an illumination system;
a structure adapted to hold a patterning component in an illumination path from said illumination system;
a substrate table adapted to be disposed in a path of radiation from said patterning component, said substrate table being adapted to hold a substrate;
a projection system adapted to be disposed between the patterning component and the substrate table; and
a sensor arranged to detect secondary radiation resulting from an interaction of illumination radiation from said illumination system with a material of the substrate, wherein, in use, the secondary radiation comprises luminescence radiation, or desorbed particles, or free charges, or any combination thereof.

2. A lithographic projection apparatus according to claim 1, wherein, in use, luminescence radiation results from an interaction of the illumination radiation with the material of the substrate, and wherein the sensor is arranged to detect the resulting luminescence radiation.

3. A lithographic projection apparatus according to claim 2, wherein said sensor comprises a detector.

4. A lithographic projection apparatus according to claim 3, wherein the detector is provided with a radiation guide to direct the luminescence radiation to the detector.

5. A lithographic projection apparatus according to claim 4, wherein said radiation guide comprises a reflective element, an optical fiber, or both.

6. A lithographic projection apparatus according to claim 4, wherein the detector is remote from said projection system.

7. A lithographic projection apparatus according to claim 3, wherein the detector comprises a photodiode, a photomultiplier tube, or both.

8. A lithographic projection apparatus according to claim 1, wherein said sensor comprises a plurality of detectors and an arrangement to sum their outputs.

9. A lithographic projection apparatus according to claim 1, wherein said sensor comprises a plurality of detectors arranged around a periphery of said substrate.

10. A lithographic projection apparatus according to claim 1, further comprising an integrator in communication with said sensor, wherein said integrator is adapted to integrate over time the output of said sensor.

11. A lithographic projection apparatus according to claim 1, further comprising a controller responsive to the output of said sensor and adapted to control a dose delivered by said illumination radiation in an exposure.

12. A lithographic projection apparatus according to claim 1, wherein said illumination system is adapted to supply illumination radiation having a wavelength of less than 200 nm.

13. A lithographic projection apparatus according to claim 2, wherein said luminescence radiation is light in the visible spectrum, the infrared spectrum, or both.

14. A lithographic projection apparatus according to claim 1, wherein, in use, desorbed particles from said material result from an interaction of the illumination radiation with the material of the substrate, and said sensor is a particle detector adapted to detect the particles desorbed from the material.

15. A lithographic projection apparatus according to claim 14, wherein said particle detector is positioned to generally face a surface of the substrate such that the particles desorbed from the material are intercepted by the particle detector.

16. A lithographic projection apparatus according to claim 14, wherein said material at the surface of the substrate is a resist layer deposited on the surface of the substrate.

17. A lithographic projection apparatus according to claim 14, wherein said particle detector comprises a channeltron.

18. A lithographic projection apparatus according to claim 17, wherein said particle detector further comprises a mass selector.

19. A lithographic projection apparatus according to claim 14, wherein said particle detector comprises a plurality of detection devices arranged around a periphery of said substrate.

20. A lithographic projection apparatus according to claim 1, wherein, in use, free charges result from an interaction of the illumination radiation with the material of the substrate, and said sensor is a free charge detector configured to detect the free charges.

21. A lithographic projection apparatus according to claim 20, wherein said free charges comprise electrons.

22. A lithographic projection apparatus according to claim 20, wherein the free charge detector comprises an electrode and said electrode is positioned to be in contact with a surface of the substrate such that the free charges flow from the surface towards the electrode.

23. A lithographic projection apparatus according to claim 20, wherein the free charge detector comprises a plurality of electrodes disposed to be in contact with a surface of the substrate and distributed around the periphery of the surface of the substrate such that the free charges flow from the surface of the substrate toward the electrodes.

24. A lithographic projection apparatus according to claim 20, wherein said material at a surface of the substrate is a semiconductor material, a conductive material, or both.

25. A lithographic projection apparatus, comprising:
an illumination system;
patterning component adapted to be disposed in an illumination path from said illumination system;
substrate table adapted to be disposed in a path of radiation from said patterning component, said substrate table adapted to hold a substrate;
projection system adapted to be disposed between the patterning component and the substrate table; and
detection means for detecting secondary radiation caused by interaction of radiation from said illumination system with the substrate wherein, in use, the detected secondary radiation comprises luminescence radiation, or desorbed particles, or free charges, or any combination thereof.

26. A lithographic projection apparatus according to claim 25, wherein said secondary radiation detected by the detection means during use comprises luminescence radiation.

27. A lithographic projection apparatus according to claim 25, wherein said secondary radiation detected by the detection means during use comprises desorbed particles.

28. A lithographic projection apparatus according to claim 25, wherein said secondary radiation detected by the detection means during use comprises free charges.

29. A device manufacturing method comprising:
projecting a beam of radiation onto a patterning component to endow the projection beam with a pattern in its cross-section;
projecting the patterned beam of radiation onto a target area of a substrate with a projection system; and
detecting secondary radiation comprising resulting from interaction of the beam of radiation with the substrate, wherein the detected secondary radiation comprises luminescence radiation, or desorbed particles, or free charges, or any combination thereof.

30. A device manufacturing method according to claim 29, wherein said detected secondary radiation comprises luminescence radiation given off by the substrate.

31. A device manufacturing method according to claim 29, wherein said detected secondary radiation comprises particles desorbed from a surface of the substrate.

32. A device manufacturing method according to claim 29, wherein said detected secondary radiation comprises free charges formed at a surface of the substrate.

* * * * *